(12) United States Patent
Kojima et al.

(10) Patent No.: US 8,368,089 B2
(45) Date of Patent: Feb. 5, 2013

(54) SEMICONDUCTOR LIGHT EMITTING DEVICE

(75) Inventors: Akihiro Kojima, Kanagawa-ken (JP);
Hiroshi Koizumi, Kanagawa-ken (JP);
Yoshiaki Sugizaki, Kanagawa-ken (JP);
Tomomichi Naka, Kanagawa-ken (JP);
Yasuhide Okada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 320 days.

(21) Appl. No.: 12/885,777

(22) Filed: Sep. 20, 2010

(65) Prior Publication Data

US 2011/0297969 A1 Dec. 8, 2011

(30) Foreign Application Priority Data

Jun. 4, 2010 (JP) ................................. 2010-128481

(51) Int. Cl.
*H01L 29/18* (2006.01)
*H01L 33/00* (2010.01)

(52) U.S. Cl. ...................... 257/88; 257/98; 257/E33.013

(58) Field of Classification Search ............. 257/79–99, 257/184, 431, E31.013, E33.002
See application file for complete search history.

(56) References Cited

U.S. PATENT DOCUMENTS

| | | | |
|---|---|---|---|
| 5,753,940 | A | 5/1998 | Komoto |
| 6,331,450 | B1 | 12/2001 | Uemura |
| 7,847,304 | B2 * | 12/2010 | Taninaka et al. ................ 257/90 |
| 2002/0074558 | A1 | 6/2002 | Hata et al. |
| 2003/0080341 | A1 | 5/2003 | Sakano et al. |
| 2004/0021145 | A1* | 2/2004 | Hamano et al. ................ 257/88 |
| 2006/0273335 | A1 | 12/2006 | Asahara et al. |
| 2007/0284755 | A1 | 12/2007 | Nomoto et al. |
| 2009/0231833 | A1* | 9/2009 | Miki et al. ...................... 362/84 |
| 2010/0148198 | A1 | 6/2010 | Sugizaki et al. |
| 2011/0114978 | A1 | 5/2011 | Kojima et al. |
| 2011/0233585 | A1 | 9/2011 | Kojima et al. |

FOREIGN PATENT DOCUMENTS

| | | |
|---|---|---|
| EP | 1 198 016 A2 | 4/2002 |
| EP | 2 065 948 A2 | 6/2009 |

OTHER PUBLICATIONS

Partial European Search Report for European Patent Application Serial No. 10186526.9 mailed on Jul. 7, 2011.
Extended European Search Report for Application No. 10186526.9-1226 mailed on Sep. 27, 2011.
Extended European Search Report for European Application No. 11188405.2 issued on Jan. 27, 2012.

\* cited by examiner

*Primary Examiner* — Chuong A Luu
*Assistant Examiner* — Nga Doan
(74) *Attorney, Agent, or Firm* — Turocy & Watson, LLP

(57) ABSTRACT

According to one embodiment, a semiconductor light emitting device includes a semiconductor layer, a first electrode, a second electrode, a transparent layer, and a fluorescent material layer. The transparent layer is provided on the first major surface of the semiconductor layer. The transparent layer is transparent with respect to light emitted by the light emitting layer and has a trench provided outside the outer circumference of the light emitting layer. The fluorescent material layer is provided in the trench and on the transparent layer. The fluorescent material layer includes a first fluorescent material particle provided in the trench and a second fluorescent material particle provided on the transparent layer. A particle size of the first fluorescent material particle is smaller than a width of the trench. A particle size of the second fluorescent material particle is larger than the width of the trench and larger than the particle size of the first fluorescent material particle.

20 Claims, 8 Drawing Sheets

SEMICONDUCTOR LIGHT EMITTING DEVICE

CROSS-REFERENCE TO RELATED APPLICATION

This application is based upon and claims the benefit of priority from Japanese Patent Application No. 2010-128481, filed on Jun. 4, 2010; the entire contents of which are incorporated herein by reference.

FIELD

Embodiments described herein relate generally to a semiconductor light emitting device.

BACKGROUND

Semiconductor light emitting devices, which obtain white light by combining an LED (Light Emitting Diode) chip with a fluorescent material layer, are known. Such a chip emits light also from the side face thereof. To suppress chromaticity shift, it is necessary to consider light emitted from the chip side face during the design.

DETAILED DESCRIPTION

Figure 1A:
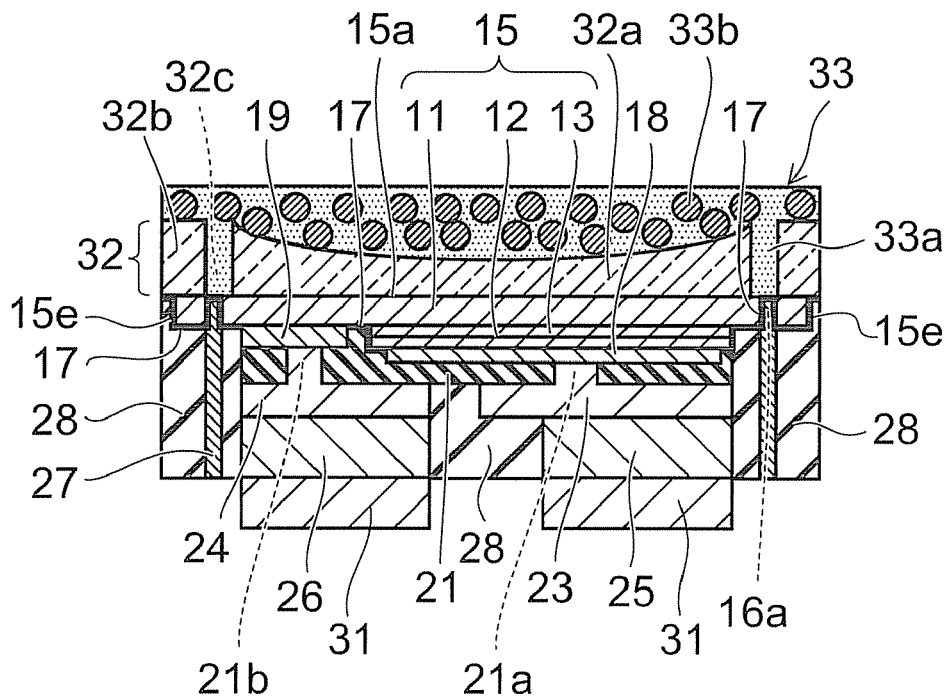
FIGS. 1A and 1B are schematic views of a semiconductor light emitting device of a first embodiment.

According to one embodiment, a semiconductor light emitting device includes a semiconductor layer, a first electrode, a second electrode, a transparent layer, and a fluorescent material layer. The semiconductor layer includes a light emitting layer, a first major surface, and a second major surface opposite to the first major surface. The first electrode is provided on the second major surface in a region including the light emitting layer. The second electrode is provided on the second major surface outside an outer circumference of the light emitting layer. The transparent layer is provided on the first major surface of the semiconductor layer. The transparent layer is transparent with respect to light emitted by the light emitting layer and has a trench provided outside the outer circumference of the light emitting layer. The fluorescent material layer is provided in the trench and on the transparent layer. The fluorescent material layer includes a first fluorescent material particle provided in the trench and a second fluorescent material particle provided on the transparent layer. A particle size of the first fluorescent material particle is smaller than a width of the trench. A particle size of the second fluorescent material particle is larger than the width of the trench and larger than the particle size of the first fluorescent material particle.

Exemplary embodiments will now be described with reference to the drawings. Similar components in the drawings are marked with like reference numerals.

First Embodiment

FIG. 1A is a schematic cross-sectional view of a semiconductor light emitting device of this embodiment.

The semiconductor light emitting device of this embodiment includes a package structure portion, a transparent layer 32, and a fluorescent material layer 33 formed collectively in the wafer state. The package structure portion includes a semiconductor layer 15, interconnect layers, metal pillars, a reinforcing resin, etc. Light is extracted externally mainly from a first major surface 15a of the semiconductor layer 15. The package structure portion is provided on a side opposite to the light extraction face. The transparent layer 32 and the fluorescent material layer 33 are provided on the light extraction face side.

The semiconductor layer 15 includes a first semiconductor layer 11 and a second semiconductor layer 13. The first semiconductor layer 11 is, for example, an n-type GaN layer that functions as a lateral current path. However, the conductivity type of the first semiconductor layer 11 is not limited to the n-type; and the conductivity type may be a p-type. The second semiconductor layer 13 includes a light emitting layer 12 and, for example, a p-type GaN layer and an n-type GaN layer with the light emitting layer 12 interposed therebetween. The second semiconductor layer 13 is provided on the side opposite to the first major surface 15a.

A protruding portion and a recessed portion are provided on the second major surface of the semiconductor layer 15 on the side opposite to the first major surface 15a. The protruding portion has a stacked structure of the first semiconductor layer 11 and the second semiconductor layer 13. A p-side electrode 18 is provided as a first electrode on the surface of the protruding portion (the surface of the second semiconductor layer 13). The surface (the bottom face) of the recessed portion is the surface of the first semiconductor layer 11 where an n-side electrode 19 is provided as a second electrode.

The p-side electrode 18 is formed in a region including the light emitting layer 12 in the surface direction of the semiconductor layer 15. The n-side electrode 19 is formed outside the outer circumference (the end portion) of the light emitting layer 12 as viewed in the surface direction.

Figure 2A:
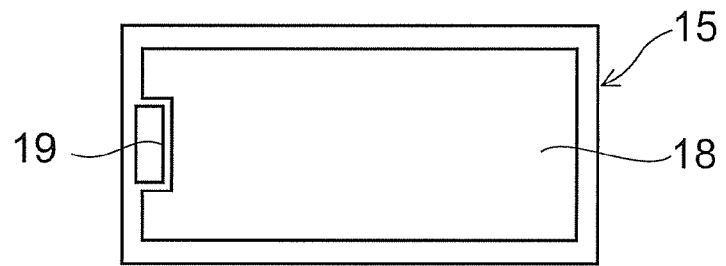
FIGS. 2A to 2C are schematic plane views illustrating a planar layout of the main part of the semiconductor light emitting device.

FIG. 2A illustrates one example of a planar layout of the p-side electrode 18 and the n-side electrode 19. The surface area of the p-side electrode 18 formed in the light emitting region is greater than the surface area of the n-side electrode 19.

An insulating film 17 made of, for example, a silicon oxide film, etc., covers the second major surface side of the semiconductor layer 15 as shown FIG. 1A. The p-side electrode 18 and the n-side electrode 19 are exposed from the insulating film 17. An insulating layer 21 is provided on the second major surface side to cover the insulating film 17, a portion of the n-side electrode 19, and a portion of the p-side electrode 18. The insulating layer 21 is, for example, a resin or a silicon oxide film.

Figure 2B:
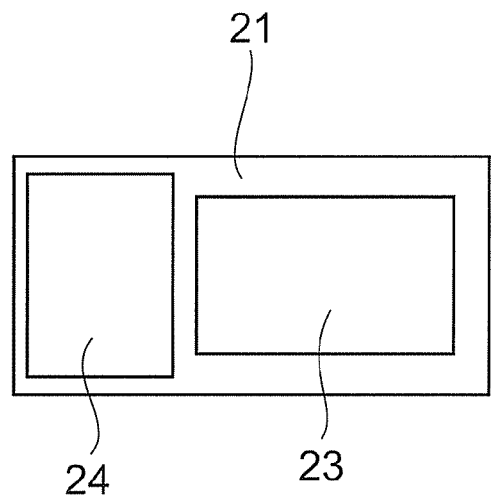

The face of the insulating layer 21 on the side opposite to the p-side electrode 18 and the n-side electrode 19 is planarized; a p-side interconnect layer 23 is provided on the planarized face as a first interconnect layer; and an n-side interconnect layer 24 is provided on the planarized face as a second interconnect layer. FIG. 2B illustrates one example of a planar layout of the p-side interconnect layer 23 and the n-side interconnect layer 24. The layout of the n-side interconnect layer 24 on the insulating layer 21 has a surface area greater than that of the n-side electrode 19.

The p-side interconnect layer 23 is provided also in a first opening 21a made in the insulating layer 21 to reach the p-side electrode 18; and the p-side interconnect layer 23 is electrically connected to the p-side electrode 18. The n-side interconnect layer 24 is provided also in a second opening 21b made in the insulating layer 21 to reach the n-side electrode 19; and the n-side interconnect layer 24 is electrically connected to the n-side electrode 19.

Figure 2C:
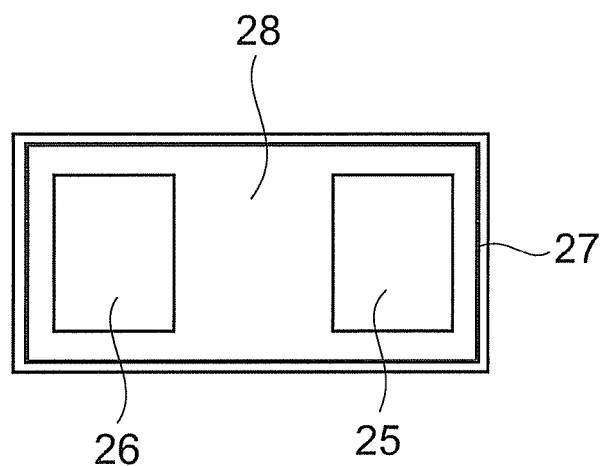

A p-side metal pillar 25 is provided as a first metal pillar on the face of the p-side interconnect layer 23 on the side opposite to the p-side electrode 18. An n-side metal pillar 26 is provided as a second metal pillar on the face of the n-side interconnect layer 24 on the side opposite to the n-side electrode 19. FIG. 2C illustrates one example of a planar layout of the p-side metal pillar 25 and the n-side metal pillar 26.

A resin layer 28 covers the p-side interconnect layer 23, the n-side interconnect layer 24, the periphery of the p-side metal pillar 25, and the periphery of the n-side metal pillar 26. A portion of the resin layer 28 covers an end portion 15e of the semiconductor layer 15 via the insulating film 17.

The first semiconductor layer 11 is electrically connected to the n-side metal pillar 26 via the n-side electrode 19 and the n-side interconnect layer 24. The second semiconductor layer 13 is electrically connected to the p-side metal pillar 25 via the p-side electrode 18 and the p-side interconnect layer 23. External terminals 31 such as, for example, solder balls, metal bumps, etc., are provided on the lower end faces of the n-side metal pillar 26 and the p-side metal pillar 25 exposed from the resin layer 28. The semiconductor light emitting device is electrically connectable to an external circuit via the external terminals 31.

The surface area of the n-side interconnect layer 24 connected to the n-side electrode 19 provided on the portion of the semiconductor layer 15 not including the light emitting layer 12, is greater at the face on the side opposite to the n-side electrode 19 than at the face on the n-side electrode 19 side. In other words, the contact surface area between the n-side interconnect layer 24 and the n-side metal pillar 26 is greater than the contact surface area between the n-side interconnect layer 24 and the n-side electrode 19. The contact surface area between the p-side interconnect layer 23 and the p-side metal pillar 25 is greater than the contact surface area between the p-side interconnect layer 23 and the p-side electrode 18. Further, a portion of the n-side interconnect layer 24 extends on the insulating layer 21 to a position to overlay below the light emitting layer 12.

Thereby, a larger draw out electrode can be formed via the n-side interconnect layer 24 from the n-side electrode 19 provided on a portion of the semiconductor layer 15 not including the light emitting layer 12 and having a small surface area while maintaining a high light output by having a larger light emitting layer 12.

Each of the thickness of the n-side metal pillar 26 and the thickness of the p-side metal pillar 25 (the thickness in the vertical direction in FIG. 1A) is thicker than the thickness of a stacked body including the semiconductor layer 15, the n-side electrode 19, the p-side electrode 18, the insulating film 17, the insulating layer 21, the n-side interconnect layer 24, and the p-side interconnect layer 23. The aspect ratios of the metal pillars 25 and 26 (the ratio of the thickness to the planar size) are not limited to 1 or more; and the ratios may be less than 1. In other words, the thicknesses of the metal pillars 25 and 26 may be smaller than the planar sizes thereof.

According to the structure of this embodiment, it is possible to maintain the mechanical strength even in the case where the semiconductor layer 15 is thin by increasing the thicknesses of the n-side metal pillar 26, the p-side metal pillar 25, and the resin layer 28. In the case of mounting on a circuit board and the like, the n-side metal pillar 26 and the p-side metal pillar 25 can absorb and mitigate the stress applied to the semiconductor layer 15 via the external terminals 31.

It is desirable for the resin layer 28, which functions as reinforcing the n-side metal pillar 26 and the p-side metal pillar 25, to be a substance having a coefficient of thermal expansion equal to or near that of the circuit board and the like. Examples of such a resin layer 28 may include, for example, epoxy resin, silicone resin, fluorocarbon resin, etc.

As illustrated in FIG. 1A and FIG. 2C, a first separating trench 16a is formed in the resin layer 28 and outside the n-side metal pillar 26 and the p-side metal pillar 25 to divide the resin layer 28 and the semiconductor layer 15. A light shielding metal 27 is provided in the first separating trench 16a.

The light shielding metal 27 is provided in a pillar configuration piercing the resin layer 28 and the semiconductor layer 15 proximally to the end portion 15e. The insulating film 17 is formed on the inner wall of the first separating trench 16a. The insulating film 17 is interposed between the semiconductor layer 15 and the light shielding metal 27.

The first separating trench 16a separates the semiconductor layer 15 into the light emitting region connected to the electrodes, the interconnect layers, etc., and the non-light emitting portion outside thereof. The first separating trench 16a continuously encloses the periphery of the light emitting region. Accordingly, the light shielding metal 27 continuously encloses the periphery of the light emitting region as shown in FIG. 2C. The light shielding metal 27 extends from the semiconductor layer 15 side to substantially the same position as the lower face of the n-side metal pillar 26 or the lower face of the p-side metal pillar 25. Accordingly, the light from the side face of the portions below the first major surface 15a is shielded by the light shielding metal 27 and is not emitted externally.

The materials of the n-side interconnect layer 24, the p-side interconnect layer 23, the n-side metal pillar 26, the p-side metal pillar 25, and the light shielding metal 27 may include copper, gold, nickel, silver, etc. Thereof, copper is more favorable because copper provides good thermal conductivity, high migration resistance, and excellent adhesion with insulating films.

The transparent layer 32 is provided on the first major surface 15a of the semiconductor layer 15. The transparent layer 32 is made of a material transparent with respect to the light emitted by the light emitting layer 12 and is made of, for example, a resin material.

Figure 1B:
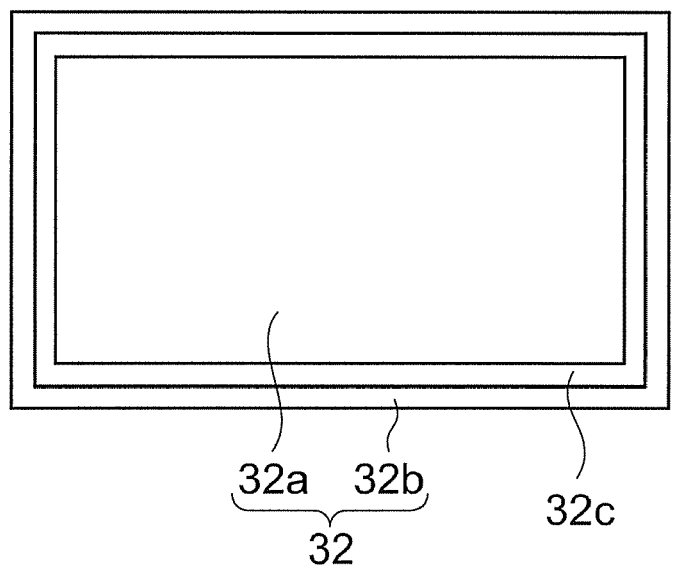

A trench 32c is formed in the transparent layer 32 outside the outer circumference (the end portion) of the light emitting layer 12 in the surface direction. The trench 32c separates the transparent layer 32 into a lens portion 32a provided on the light emitting region and a dicing portion 32b provided in the dicing region. As illustrated in FIG. 1B, the trench 32c continuously encloses the periphery of the lens portion 32a.

The fluorescent material layer 33 is provided in the trench 32c and on the transparent layer 32. The fluorescent material layer 33 has a structure in which a first fluorescent material particle (phosphor particle) 33a and a second fluorescent material particle (phosphor particle) 33b are dispersed in a transparent resin. The first fluorescent material particle 33a and a second fluorescent material particle 33b have different particle sizes. The transparent resin in which the first fluorescent material particle 33a and a second fluorescent material particle 33b are dispersed is transparent to the light emitted by the light emitting layer 12 the light from and the fluorescent material particles 33a and 33b.

The first fluorescent material particle 33a and the second fluorescent material particle 33b are distributed together on the transparent layer 32. The first fluorescent material particle 33a and the second fluorescent material particle 33b exist together above the light emitting layer 12. The particle size of the first fluorescent material particle 33a is smaller than the width of the trench 32c. The particle size of the second fluorescent material particle 33b is larger than the width of the trench 32c and the particle size of the first fluorescent material particle 33a. Accordingly, the second fluorescent material particle 33b does not enter the trench 32c; and only the first fluorescent material particle 33a enters the trench 32c.

The light emitted by the light emitting layer 12 travels mainly through the first semiconductor layer 11, the first major surface 15a, the transparent layer 32, and the fluorescent material layer 33 to be emitted externally. The first fluorescent material particle 33a and the second fluorescent material particle 33b included in the fluorescent material layer 33 are capable of absorbing the light (the excitation light) from the light emitting layer 12 and emitting a wavelength-converted light. Therefore, it is possible to emit a mixed light of the light from the light emitting layer 12 and the wavelength-converted light of the fluorescent material layer 33.

The transparent layer 32 controls the thickness of the fluorescent material layer 33. Specifically, the surface direction thickness distribution of the fluorescent material layer 33 on the lens portion 32a of the transparent layer 32 is controlled according to the surface configuration of the lens portion 32a. Thereby, light distribution characteristics can be controlled. In other words, by the configuration of the transparent layer 32, it is possible to control the light distribution characteristics such that the peripheral region is relatively brighter than the center in the surface direction, or the center is brighter than the peripheral region. The surface configuration of the lens portion 32a of the transparent layer 32 is not limited to the concave configuration illustrated in the drawings; and a convex configuration may be used.

The light is not limited to being emitted in the direction directly upward from the first major surface 15a and may be emitted also in a direction oblique to the first major surface 15a. In this embodiment, the trench 32c is provided in the periphery on the light emitting region; and a portion of the fluorescent material layer 33 is filled also into the trench 32c. Therefore, the light emitted from the semiconductor layer 15 obliquely upward can travel through the fluorescent material layer 33 in the trench 32c; and chromaticity shift can be suppressed. In the trench 32c, the first fluorescent material particle 33a is formed with being dispersed in the transparent resin.

For the fluorescent material particle to exist in the trench 32c, the particle size of the fluorescent material particle is smaller than the width of the trench 32c. It is desirable to reduce the width of the trench 32c to downsize the planar size of the device; and the particle size of the fluorescent material particle also is reduced to match such a width. However, it is desirable to increase the particle size of the fluorescent material particle considering the conversion efficiency (the absorption efficiency of the excitation light). Using only a fluorescent material particle having a small particle size may lead to increasing the thickness of the fluorescent material layer to supplement the low conversion efficiency thereof which impedes having a thinner device. Increasing the thickness of the fluorescent material layer also may lead to higher material costs.

Therefore, in this embodiment, the fluorescent material layer 33 including the first fluorescent material particle 33a and the second fluorescent material particle 33b having relatively different particle sizes (average particle sizes) is used. The first fluorescent material particle 33a enters the trench 32c because the first fluorescent material particle 33a is smaller than the width of the trench 32c. Thereby, the first fluorescent material particle 33a in the trench 32c can absorb and perform wavelength conversion of the excitation light emitted in a direction oblique to the first major surface 15a. Further, because the second fluorescent material particle 33b having the larger particle size is distributed over the entire transparent layer 32 in the surface direction, a high conversion efficiency can be obtained.

The trench 32c and the first fluorescent material particle 33a existing in the trench 32c continuously enclose the periphery of the lens portion 32a of the transparent layer 32. Therefore, the first fluorescent material particle 33a can perform a wavelength conversion over the entire circumferential direction of the light emitting region.

The first fluorescent material particle 33a includes multiple types of fluorescent material particles having different light emission peak wavelengths (e.g., a red fluorescent material particle and a green fluorescent material particle). Similarly, the second fluorescent material particle 33b includes multiple types of fluorescent material particles having different light emission peak wavelengths (e.g., a red fluorescent material particle and a green fluorescent material particle).

For example, white light or lamp light can be obtained with high color rendition can be obtained by mixing blue light, red light, and green light by using a substance that emits blue light as the light emitting layer 12 and using a red fluorescent material particle and a green fluorescent material particle as the first fluorescent material particle 33a and the second fluorescent material particle 33b. The color rendition is the property determining how the color of an object appears in the case where a light source is used for illumination. The red fluorescent material particle emits red light when excited by the blue light. The green fluorescent material particle emits green light when excited by the blue light. A red fluorescent material particle may be used as the first fluorescent material particle 33a and a green fluorescent material particle may be used as the second fluorescent material particle 33b.

By using a substance having a composition in which a light emission center element is added to a SiAlON compound such as the examples recited below as the fluorescent material particle, the temperature characteristics of the wavelength conversion efficiency can be improved; and the efficiency in the high current density region can be increased further. Because green SiAlON-based fluorescent materials and red SiAlON-based fluorescent materials are excited by blue light with high efficiency, a high efficiency light emitting device having various hues can be obtained by combining with a light emitting layer that emits blue light. White light having a higher color rendition can be obtained and deterioration at high temperatures can be suppressed by using a red SiAlON-based fluorescent material and a green SiAlON-based fluorescent material combined with blue excitation light more so than in the case where a yellow fluorescent material is combined with blue excitation light. Red SiAlON-based fluorescent materials are excitable with high efficiency in a wide excitation band from ultraviolet light to blue light, have a broad light emission spectrum, and are particularly suitable for white LEDs.

For example, as the red fluorescent material, a substance may be used that has a light emission peak at a wavelength between 580 nm to 700 nm when excited by light having a wavelength of 250 nm to 500 nm and satisfies Formula (1) recited below.

$$(M_{1-x}R_x)_{a1}AlSi_{b1}O_{c1}N_{d1} \quad (1)$$

In Formula (1) recited above, M is at least one type of metal element excluding Si and Al, and it may be desirable for M to be at least one selected from Ca and Sr. R is a light emission center element, and it may be desirable for R to be Eu.

For example, M is at least one type selected from the group consisting of Mg, Ca, Sr, Ba, Y, Gd, La, Lu, Sc, Li, Na, K, B, Ga, In, and Ge. R is at least one type selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe. Here, x, a1, b1, c1, and d1 satisfy the relationships $0<x\leq1$, $0.6<a1<0.95$, $2<b1<3.9$, $0.25<c1<0.45$, and $4<d1<5.7$.

By using the SiAlON-based fluorescent material of Compositional Formula (1) recited above, the temperature characteristics of the wavelength conversion efficiency can be improved; and the efficiency in the high current density region can be increased further.

For example, as the green fluorescent material, a substance may be used that has a light emission peak at a wavelength between 490 nm to 580 nm when excited by light having a wavelength of 250 nm to 500 nm and satisfies Formula (2) recited below.

$$(M_{1-x}R_x)_{a2}AlSi_{b2}O_{c2}N_{d2} \quad (2)$$

In Formula (2) recited above, M is at least one type of metal element excluding Si and Al, and it may be desirable for M to be at least one selected from Ca and Sr. R is a light emission center element, and it may be desirable for R to be Eu.

For example, M is at least one type selected from the group consisting of Mg, Ca, Sr, Ba, Y, Gd, La, Lu, Sc, Li, Na, K, B, Ga, In, and Ge. R is at least one type selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe. Here, x, a2, b2, c2, and d2 satisfy the relationships $0<x\leq1$, $0.93<a2<1.3$, $4.0<b2<5.8$, $0.6<c2<1$, and $6<d2<11$.

By using the SiAlON-based fluorescent material of Compositional Formula (2) recited above, the temperature characteristics of the wavelength conversion efficiency can be improved; and the efficiency in the high current density region can be increased further.

Alternatively, as the green fluorescent material, a substance may be used that has a light emission peak at a wavelength between 490 nm to 580 nm when excited by light having a wavelength of 250 nm to 500 nm and satisfies Formula (3) recited below.

$$(M_{1-x}R_x)_{a2}AlSi_{b2}O_{c2}N_{d2} \quad (3)$$

In General Formula (3) recited above, M is at least one type of metal element excluding Si and Al, and it may be desirable for M to be at least one selected from Ca and Sr. R is a light emission center element, and it may be desirable for R to be Eu.

For example, M is at least one type selected from the group consisting of Mg, Ca, Sr, Ba, Y, Gd, La, Lu, Sc, Li, Na, K, B, Ga, In, and Ge. R is at least one type selected from the group consisting of Eu, Ce, Mn, Tb, Yb, Dy, Sm, Tm, Pr, Nd, Pm, Ho, Er, Gd, Cr, Sn, Cu, Zn, Ga, Ge, As, Ag, Cd, In, Sb, Au, Hg, Tl, Pb, Bi, and Fe. Here, x, a2, b2, c2, and d2 satisfy the relationships $0<x\leq1$, $0.94<a2<1.1$, $4.1<b2<4.7$, $0.7<c2<0.85$, and $7<d2<9$.

By using the SiAlON-based fluorescent material of Compositional Formula (3) recited above, the temperature characteristics of the wavelength conversion efficiency can be improved; and the efficiency in the high current density region can be increased further.

Further, a nitride-based fluorescent material such as, for example, $CaAlSiN_3$:Eu may be used as the red fluorescent material. A halophosphate-based fluorescent material such as, for example, $(Ba, Ca, Mg)_{10}(PO_4)_6.Cl_2$:Eu may be used as the green fluorescent material.

Also, a yellow fluorescent material may be used as the first fluorescent material particle 33a and the second fluorescent material particle 33b. A silicate-based fluorescent material such as, for example, $(Sr,Ca,Ba)_2SiO_4$:Eu may be used as the yellow fluorescent material. Further, a blue fluorescent material may be used. An oxide-based fluorescent material such as, for example, $BaMgAl_{10}O_{17}$:Eu may be used as the blue fluorescent material.

In this embodiment, the light shielding metal 27 having the pillar (wall) configuration encloses the structural portion below the first major surface 15a. Thereby, lateral direction light leakage emitted externally from the side face of the semiconductor layer 15 can be prevented. Such a configuration also suppresses the chromaticity shift. In the case where the resin layer 28 is light-shielding with respect to the light from the light emitting layer 12, the lateral direction light leakage can be reliably prevented.

The lens portion 32a, which is the portion of the transparent layer 32 on the inner side of the trench 32c, is provided on the light emitting region; and the light distribution characteristics can be controlled by forming the lens portion 32a into an appropriate configuration.

In the case where the planar size of the lens portion 32a is larger than the planar size of the semiconductor layer 15, the dicing portion 32b is then formed outside the position illustrated in FIGS. 1A and 1B; and the planar size of the entire semiconductor light emitting device undesirably increases. Moreover, the optical performance may not be obtained as designed in the case where the dicing portion 32b is not provided, the lens portion 32a is extended to the dicing region, and the lens portion 32a is cut. Accordingly, it is desirable for the planar size of the lens portion 32a, which is the portion on the inner side of the trench 32c, to be smaller than the planar size of the semiconductor layer 15.

In the case where the light shielding metal 27 is provided on the inner side of the trench 32c and positioned below the lens portion 32a, the light shielding metal 27 may undesirably shield the light emitted from the side face of the light emitting layer 12 and traveling obliquely upward toward the trench 32c. Moreover, providing the light shielding metal 27 on the outer side of the trench 32c, that is, in the dicing region, may lead to an increased dicing region width. Accordingly, it is desirable for the layout of the light shielding metal 27 to be below the trench 32c.

A method for manufacturing the semiconductor light emitting device of this embodiment will now be described with reference to FIG. 3A to FIG. 7B.

Figure 3A:
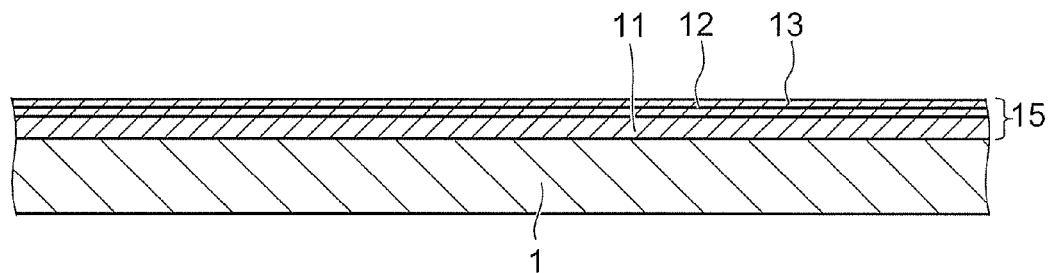
FIG. 3A to FIG. 7B are schematic cross-sectional views illustrating a method for manufacturing the semiconductor light emitting device.

As illustrated in FIG. 3A, the first semiconductor layer 11 is formed on a major surface of a substrate 1; and the second semiconductor layer 13 including the light emitting layer 12 is formed thereupon. In the case where such layers of the semiconductor layer 15 are, for example, nitride semiconductors, the semiconductor layer 15 may be formed by, for example, crystal growth on a sapphire substrate.

Figure 3B:
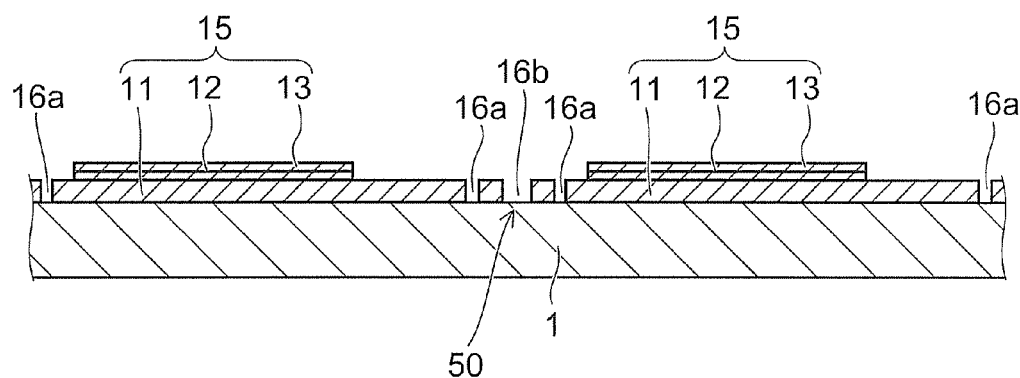

Then, a portion of the second semiconductor layer 13 is removed by, for example, Reactive Ion Etching (RIE) using a not-illustrated resist to expose a portion of the first semiconductor layer 11 as illustrated in FIG. 3B.

Then, the first separating trench 16a and a second separating trench 16b are formed. The first separating trench 16a and the second separating trench 16b reach the substrate 1 to multiply separate the semiconductor layer 15. The first separating trench 16a continuously encloses the periphery of the separated semiconductor layer 15. The second separating trench 16b is made in a dicing region 50 with, for example, a planar pattern having a lattice configuration. The second separating trench 16b is made between adjacent first separating trenches 16a.

Figure 3C:
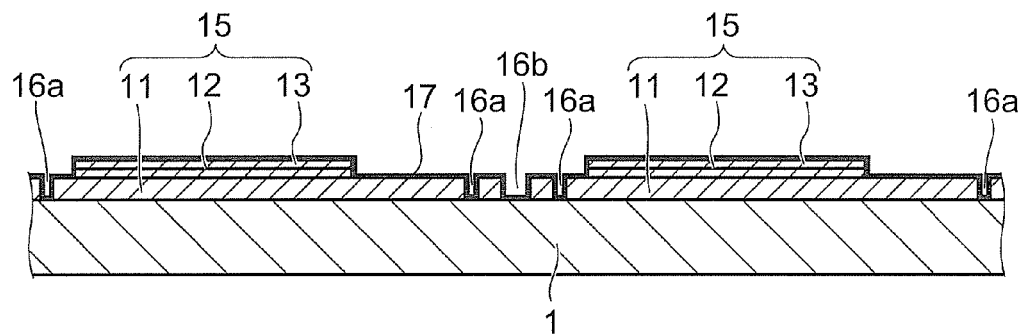

The insulating film 17 is formed on all exposed faces on the substrate 1 by, for example, Chemical Vapor Deposition (CVD) as illustrated in FIG. 3C. The insulating film 17 is formed also on the inner walls of the first separating trench 16a and the second separating trench 16b.

Figure 4A:
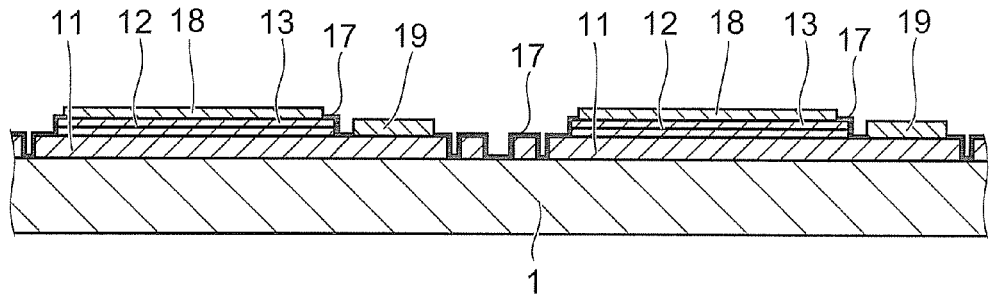

Then, as illustrated in FIG. 4A, openings are made selectively in the insulating film 17; the p-side electrode 18 is formed on the second semiconductor layer 13; and the n-side electrode 19 is formed on the second major surface of the first semiconductor layer 11.

Figure 4B:
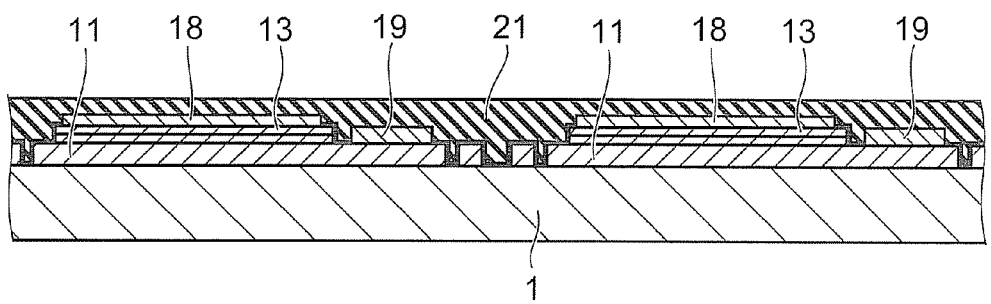
Figure 4C:
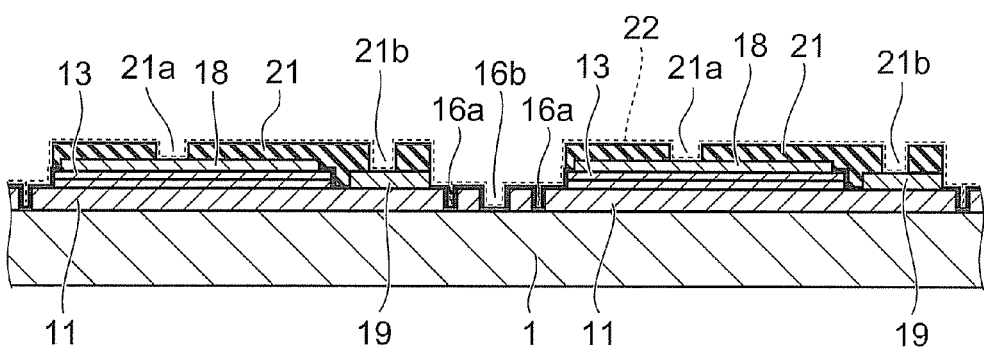

As illustrated in FIG. 4B, the insulating layer 21 covers all of the exposed portions on the substrate 1. Subsequently, the insulating layer 21 is patterned by, for example, wet etching to make the first opening 21a to reach the p-side electrode 18 and the second opening 21b to reach the n-side electrode 19 as illustrated in FIG. 4C.

Then, after forming a seed metal 22 on the upper face of the insulating layer 21 and on the inner walls (the side face and the bottom face) of the openings 21a and 21b and the separating trenches 16a and 16b and further forming a not-illustrated plating resist, Cu plating is performed using the seed metal 22 as a current path. The seed metal 22 includes, for example, Cu.

Figure 5A:
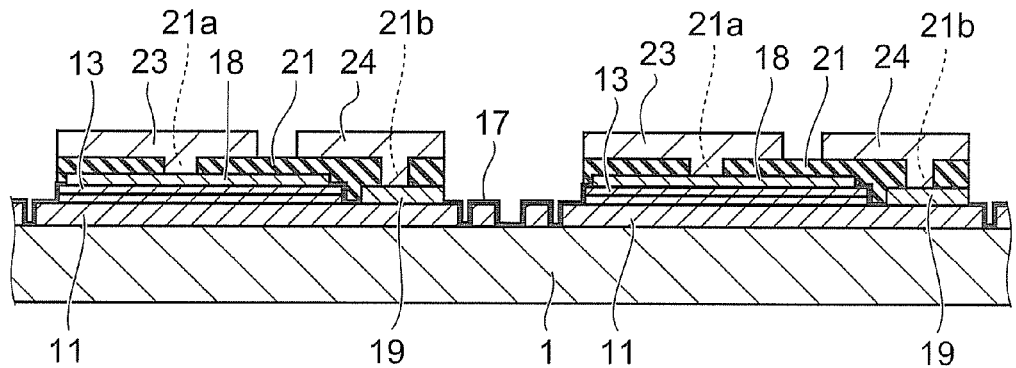

Thereby, as illustrated in FIG. 5A, the p-side interconnect layer 23 and the n-side interconnect layer 24 are formed selectively on the insulating layer 21. The p-side interconnect layer 23 is formed also in the opening 21a to connect to the p-side electrode 18. The n-side interconnect layer 24 is formed also in the opening 21b to connect to the n-side electrode 19. The p-side interconnect layer 23 and the n-side interconnect layer 24 are formed simultaneously by plating. The plating resist used during the plating of the p-side interconnect layer 23 and the n-side interconnect layer 24 is removed with a chemical solution.

Figure 5B:
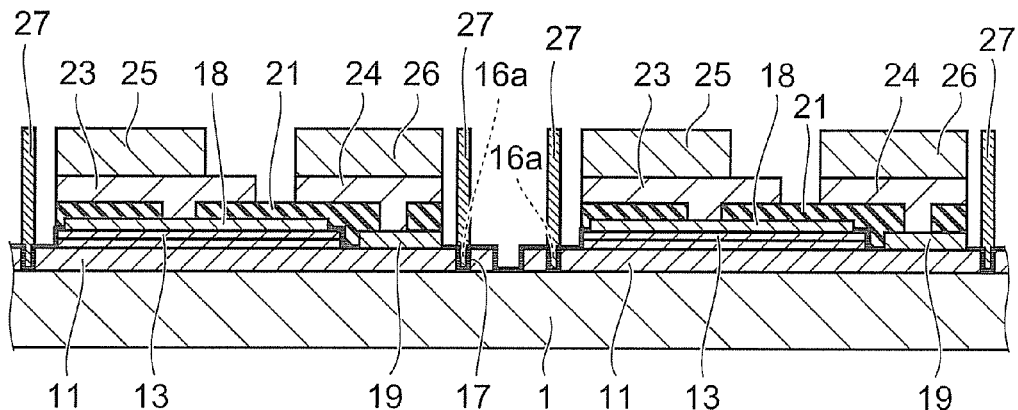

Then, another plating resist (not illustrated) is formed for forming the metal pillars; and Cu plating is performed using the seed metal 22 described above as a current path. Thereby, as illustrated in FIG. 5B, the p-side metal pillar 25 is formed above the p-side interconnect layer 23; and the n-side metal pillar 26 is formed above the n-side interconnect layer 24. Further, the seed metal 22 is formed also on the side face and the bottom face of the insulating film 17 in the first separating trench 16a; and the light shielding metal 27 is formed in the first separating trench 16a and thereabove in a pillar configuration. The other portions are covered with the plating resist; and metal does not precipitate thereupon.

The p-side metal pillar 25, the n-side metal pillar 26, and the light shielding metal 27 are formed simultaneously by the plating.

Subsequently, the plating resist for forming the metal pillars is removed with a chemical solution; and the exposed portions of the seed metal 22 also are removed. Thereby, the electrical connection between the p-side interconnect layer 23 and the n-side interconnect layer 24 via the seed metal 22 is divided. Further, the electrical connection from the light shielding metal 27 to the other electrodes and interconnect layers via the seed metal 22 also is divided.

Figure 5C:
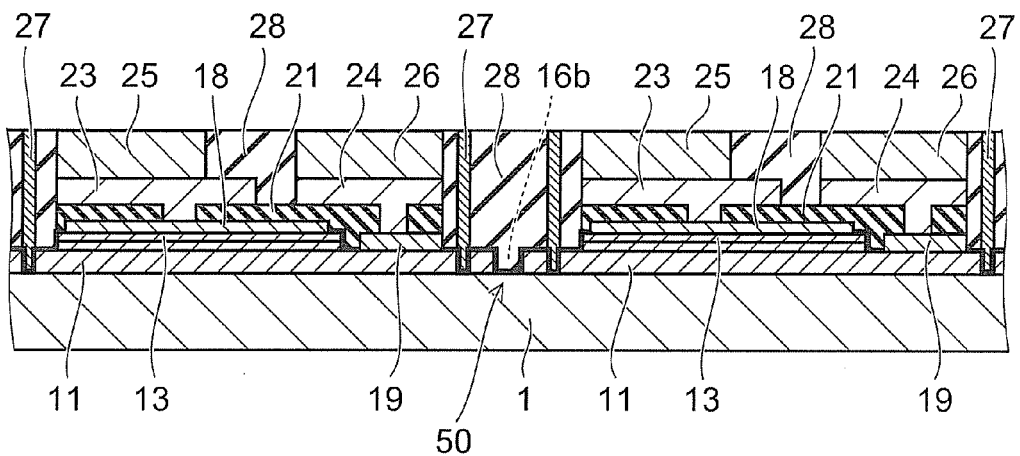

Then, as illustrated in FIG. 5C, the resin layer 28 covers the p-side interconnect layer 23, the n-side interconnect layer 24, the p-side metal pillar 25, the n-side metal pillar 26, the light shielding metal 27, the insulating film 17, and the insulating layer 21. At this time, a portion of the resin layer 28 is filled into the second separating trench 16b made in the dicing region 50.

Subsequently, the surface of the resin layer 28 is polished to expose the end faces of the p-side metal pillar 25 and the n-side metal pillar 26. Then, the external terminals 31 (FIG. 6A) such as solder balls, metal bumps, etc., are provided as necessary on the exposed faces. Subsequently, the substrate 1 is removed.

The substrate 1 may be removed from the first semiconductor layer 11 by, for example, laser lift-off. Specifically, laser light is irradiated from the backside of the substrate 1 toward the first semiconductor layer 11. The substrate 1 is transparent to the laser light; and the laser light has a wavelength in the absorption region of the first semiconductor layer 11.

When the laser light reaches the interface between the substrate 1 and the first semiconductor layer 11, the first semiconductor layer 11 proximal to the interface absorbs the energy of the laser light and decomposes. For example, in the case where the first semiconductor layer 11 is GaN, the first semiconductor layer 11 decomposes into Ga and nitrogen gas. A micro gap is formed between the substrate 1 and the first semiconductor layer 11 by the decomposition reaction; and the substrate 1 and the first semiconductor layer 11 separate. The irradiation of the laser light is performed over the entire wafer by performing multiply for each set region; and the substrate 1 is removed.

Figure 6A:
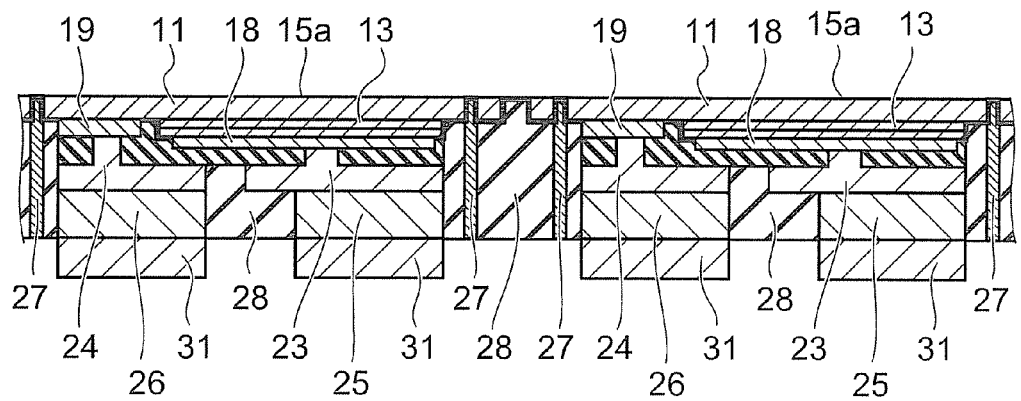
Figure 6B:
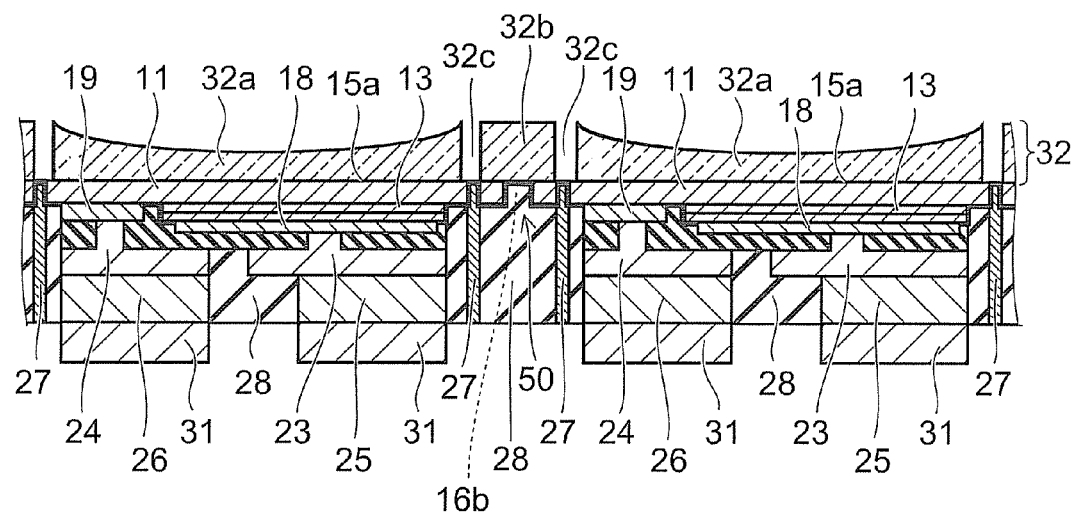

After removing the substrate 1, the transparent layer 32 is formed on the first major surface 15a as illustrated in FIG. 6B. The trench 32c is made in the transparent layer 32. The trench 32c divides the transparent layer 32 into the lens portion 32a and the dicing portion 32b. The dicing portion 32b is provided in the dicing region 50 where the second separating trench 16b is made.

The transparent layer 32 is, for example, a silicone resin having a refractive index of 1.45 and a transmittance of 99% with respect to light having a wavelength of 380 nm to 750 nm. After supplying the transparent layer 32 onto the first major surface 15a in a liquid or paste form, the transparent layer 32 is patterned by, for example, imprinting and then cured. The transparent layer 32 may be cured by, for example, irradiating an ultraviolet ray in a state in which a template is in contact with the transparent layer 32. After the curing, the template is separated from the transparent layer 32.

Figure 7A:
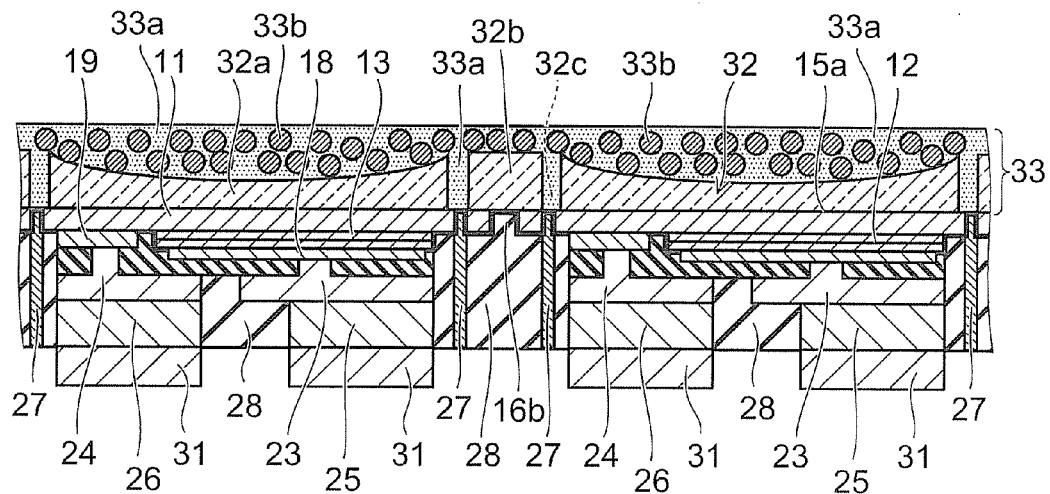

Then, as illustrated in FIG. 7A, the fluorescent material layer 33 is formed in the trench 32c and on the transparent layer 32. The fluorescent material layer 33 has a structure in which the first fluorescent material particle 33a and the second fluorescent material particle 33b described above are dispersed in a transparent resin. The proportion of the first fluorescent material particle 33a and the second fluorescent material particle 33b included in the transparent resin may be, for example, 80% by weight.

The transparent resin is, for example, a dimethylsiloxane resin having a refractive index of 1.53 and a transmittance of 99% with respect to light having a wavelength of 380 nm to 750 nm. The transparent resin is supplied into the trench 32c and onto the transparent layer 32 by printing in a vacuum (reduced pressure) in a liquid or paste form. The first fluorescent material particle 33a, which is smaller than the width of the trench 32c, enters the trench 32c. Subsequently, the transparent resin undergoes thermosetting.

The light extraction efficiency can be increased by forming the transparent layer 32 and the fluorescent material layer 33 after removing the substrate 1 from the first major surface 15a.

Figure 7B:
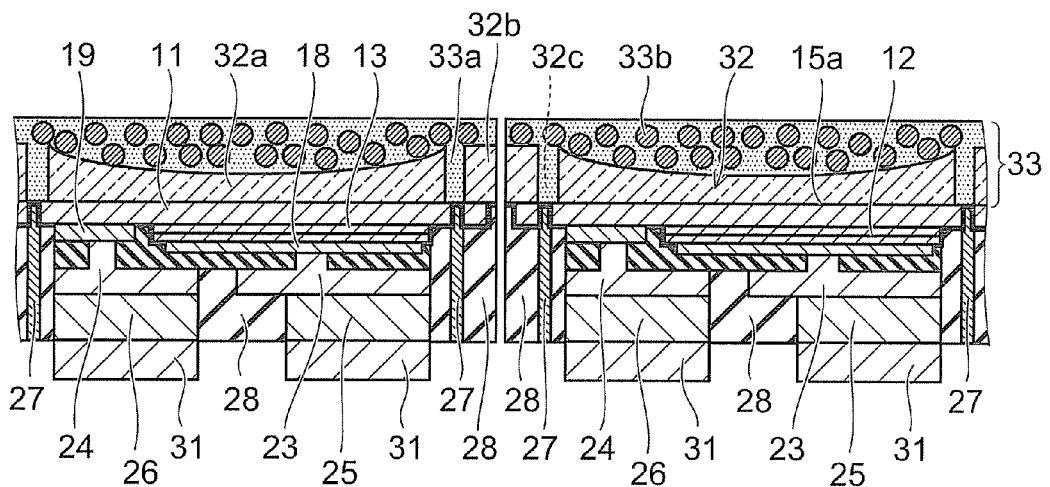

After forming the fluorescent material layer 33, singulation is performed by dicing as illustrated in FIG. 7B. At this time, the dicing is easy and the productivity can be increased because the substrate 1 has already been removed and the dicing region includes the dicing portion 32b of the transparent layer 32 and the resin layer 28, which are both resins.

Further, in the dicing region, the semiconductor layer 15 does not exist; the second separating trench 16b is formed; and a portion of the resin layer 28 is filled into the second separating trench 16b. Accordingly, damage to the semiconductor layer 15 during the dicing can be avoided. Also, because the portion in which the resin layer 28 is filled is cut, the end portion of the semiconductor layer 15 in the singulated device is covered with the resin layer 28 and protected.

The singulated semiconductor light emitting device may have a single-chip structure including one semiconductor layer 15 or a multi-chip structure including multiple semiconductor layers 15.

Because the processes described above up to the dicing are performed collectively in the wafer state, it is unnecessary to perform interconnections and packaging for each of the singulated devices; and it is possible to drastically reduce production costs. The interconnections and the packaging are already complete in the singulated state. Moreover, downsizing is easy in the case where the planar size of each device approaches the planar size of the bare chip (the semiconductor layer 15). Also, inspections are possible at the wafer level. Therefore, the productivity can be increased. As a result, cost reductions are easy.

Second Embodiment

Figure 8:
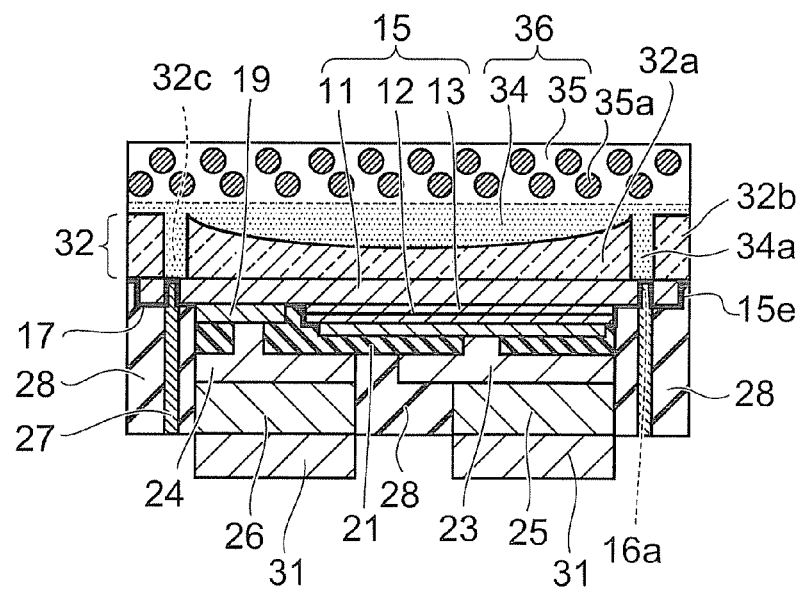
FIG. 8 is a schematic cross-sectional view of a semiconductor light emitting device of a second embodiment.

FIG. 8 is a schematic cross-sectional view of a semiconductor light emitting device of a second embodiment.

In this embodiment, a fluorescent material layer 36 includes a first fluorescent material layer 34 and a second fluorescent material layer 35 which are formed separately by two formations. The first fluorescent material layer 34 includes a first fluorescent material particle 34a which is smaller than the width of the trench 32c. The second fluorescent material layer 35 includes a second fluorescent material particle 35a which is larger than the width of the trench 32c and the first fluorescent material particle 34a.

First, the first fluorescent material layer 34 is formed. At this time, the first fluorescent material particle 34a included in the first fluorescent material layer 34 is smaller than the width of the trench 32c and therefore enters the trench 32c. After curing the first fluorescent material layer 34, the second fluorescent material layer 35 including the second fluorescent material particle 35a is formed thereupon.

In this embodiment as well, by using the first fluorescent material particle 34a which is smaller than the width of the trench 32c, the first fluorescent material particle 34a can be dispersed reliably in the trench 32c even in the case where the width of the trench 32c is reduced to suppress the increase of the planar size. By also using the second fluorescent material particle 35a which has a relatively large particle size, the decrease of the conversion efficiency can be suppressed.

Third Embodiment

Figure 9:
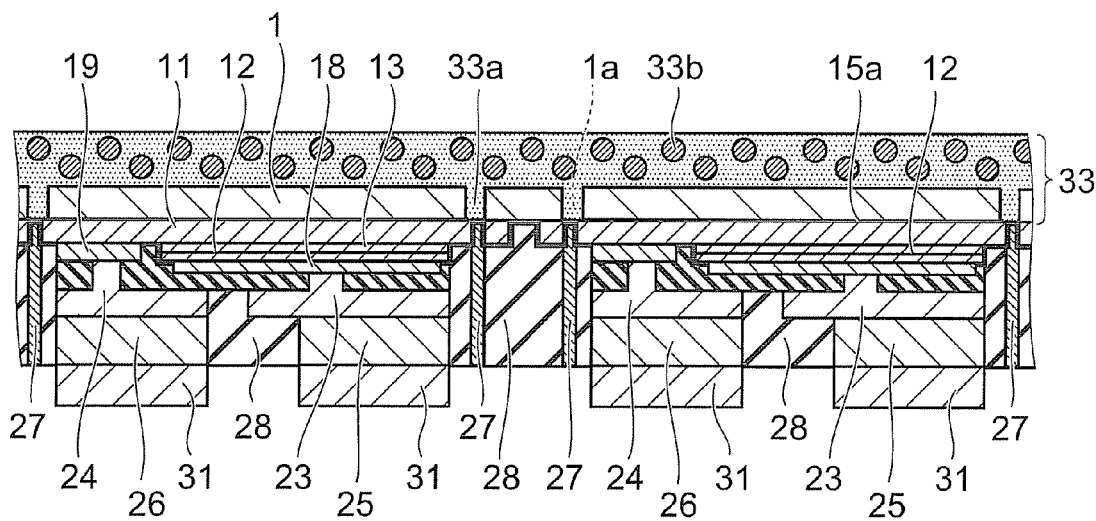
FIG. 9 is a schematic cross-sectional view of a semiconductor light emitting device of a third embodiment.

As illustrated in FIG. 9, the substrate 1 may not be removed entirely; and the substrate 1 may be polished to thinly remain on the first major surface 15a. By leaving the substrate 1 in a thin layer, the mechanical strength can be higher than that of the structure in which the substrate 1 is entirely removed; and a structure having high reliability can be provided. Because the substrate 1 remains, the warp can be suppressed after the singulation; and the mounting onto the circuit board and the like is easy.

In such a case, the substrate 1 may be used as the transparent layer described above. In other words, a trench 1a may be made in the substrate 1 outside the end portion of the light emitting layer 12 in the surface direction; and the first fluorescent material particle 33a which is smaller than the width of the trench 1a may be provided in the trench 1a. Therefore, the light emitted obliquely upward from the semiconductor layer 15 can travel through the fluorescent material layer 33 in the trench 1a; and the chromaticity shift can be suppressed.

Although the case is described in the embodiments recited above where, for example, the first fluorescent material particle and the second fluorescent material particle are different fluorescent materials having different light emission peak wavelengths or photo-luminescence spectrums, the first fluorescent material particle and the second fluorescent material particle may be fluorescent materials made of the same material having different particle sizes.

Further, the first fluorescent material particle and the second fluorescent material particle may emit light which is mutually the same such as yellow and yellow, red and red, and green and green while having mutually different excitation spectrums, light emission spectrums or photo-luminescence spectrums.

In case a size of a particle is compared with a size of another particle, the size may be average particle size. Further, in case a size of a particle is compared with a width of a trench, the size is smaller than the width if the particle can enter the trench, and the size is larger than the width if the particle can not enter the trench.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor light emitting device, comprising:
a semiconductor layer including a light emitting layer, a first major surface, and a second major surface opposite to the first major surface;
a first electrode provided on the second major surface in a region including the light emitting layer;
a second electrode provided on the second major surface outside an outer circumference of the light emitting layer;
a transparent layer provided on the first major surface of the semiconductor layer, the transparent layer being transparent with respect to light emitted by the light emitting layer and having a trench provided outside the outer circumference of the light emitting layer;
a fluorescent material layer provided in the trench and on the transparent layer, the fluorescent material layer including a first fluorescent material particle provided in the trench and a second fluorescent material particle provided on the transparent layer, a particle size of the first fluorescent material particle being smaller than a width of the trench, a particle size of the second fluorescent material particle being larger than the width of the trench and larger than the particle size of the first fluorescent material particle.

2. The device of claim 1, wherein the trench continuously encloses a periphery of the transparent layer.

3. The device of claim 1, wherein the first fluorescent material particle is provided in the trench and on the transparent layer above the light emitting layer.

4. The device of claim 1, wherein a planar size of a portion of the transparent layer on an inner side of the trench is smaller than a planar size of the semiconductor layer.

5. The device of claim 1, wherein a surface area of the first electrode is greater than a surface area of the second electrode.

6. The device of claim 1, further comprising:
an insulating layer provided on the second major surface side of the semiconductor layer, the insulating layer having a first opening reaching the first electrode and a second opening reaching the second electrode;
a first interconnect layer provided in the first opening and on a face of the insulating layer on a side opposite to the semiconductor layer to connect to the first electrode;
a second interconnect layer provided in the second opening and on a face of the insulating layer on the side opposite to the semiconductor layer to connect to the second electrode;
a first metal pillar provided on a face of the first interconnect layer on a side opposite to the first electrode;
a second metal pillar provided on a face of the second interconnect layer on a side opposite to the second electrode; and
a resin layer covering a periphery of the first metal pillar and a periphery of the second metal pillar.

7. The device of claim 6, wherein a portion of the resin layer covers an end portion of the semiconductor layer.

8. The device of claim 6, wherein each of a thickness of the first metal pillar and a thickness of the second metal pillar is thicker than a thickness of a stacked body including the semiconductor layer, the first electrode, the second electrode, the insulating layer, the first interconnect layer, and the second interconnect layer.

9. The device of claim 6, further comprising a light shielding metal provided in a separating trench which is provided in the resin layer and outside the first metal pillar and the second metal pillar, the separating trench dividing the resin layer and the semiconductor layer.

10. The device of claim 9, wherein the light shielding metal continuously encloses a periphery of a light emitting region of the semiconductor layer.

11. The device of claim 9, wherein the light shielding metal is provided outside a portion of the transparent layer provided on an inner side of the trench.

12. The device of claim 9, wherein the light shielding metal extends from the semiconductor layer side to substantially a similar position to a lower end of the first metal pillar or a lower end of the second metal pillar.

13. The device of claim 9, wherein the light shielding metal is provided below the trench.

14. The device of claim 1, wherein the first fluorescent material particle and the second fluorescent material particle are substantially same fluorescent material and differ in particle size.

15. The device of claim 1, wherein the first fluorescent material particle and the second fluorescent material particle are different fluorescent material.

16. The device of claim 1, wherein the first fluorescent material particle and the second fluorescent material particle have substantially same photo-luminescence spectrums.

17. The device of claim 1, wherein the first fluorescent material particle and the second fluorescent material particle have different photo-luminescence spectrums.

18. A semiconductor light emitting device, comprising:
a semiconductor layer including a light emitting layer, a first major surface, and a second major surface opposite to the first major surface;
a first electrode provided on the second major surface in a region including the light emitting layer;
a second electrode provided on the second major surface outside an outer circumference of the light emitting layer;
an insulating layer provided on the second major surface side of the semiconductor layer, the insulating layer having a first opening reaching the first electrode and a second opening reaching the second electrode;
a first interconnect layer provided in the first opening and on a face of the insulating layer on a side opposite to the semiconductor layer to connect to the first electrode;
a second interconnect layer provided in the second opening and on a face of the insulating layer on the side opposite to the semiconductor layer to connect to the second electrode;
a first metal pillar provided on a face of the first interconnect layer on a side opposite to the first electrode;
a second metal pillar provided on a face of the second interconnect layer on a side opposite to the second electrode;
a resin layer covering a periphery of the first metal pillar and a periphery of the second metal pillar; and
a light shielding metal provided in a separating trench which is provided in the resin layer and outside the first metal pillar and the second metal pillar, the separating trench dividing the resin layer and the semiconductor layer.

19. The device of claim 18, wherein the light shielding metal continuously encloses a periphery of a light emitting region of the semiconductor layer.

20. The device of claim 18, wherein the light shielding metal extends from the semiconductor layer side to substantially a similar position to a lower end of the first metal pillar or a lower end of the second metal pillar.

* * * * *